United States Patent [19]

Ishikawa

[11] Patent Number: 4,731,871
[45] Date of Patent: Mar. 15, 1988

[54] TUNING DEVICE FOR LIQUID CRYSTAL TELEVISION

[75] Inventor: Ryo Ishikawa, Tokyo, Japan

[73] Assignee: Casio Computer Co., Ltd., Tokyo, Japan

[21] Appl. No.: 928,811

[22] Filed: Nov. 7, 1986

[30] Foreign Application Priority Data

Nov. 18, 1985 [JP] Japan ............................. 60-258415

[51] Int. Cl.⁴ .............................................. H04B 1/16
[52] U.S. Cl. .................................... 455/182; 455/183; 455/260; 455/265; 358/191.1
[58] Field of Search ............... 455/164, 165, 182, 183, 455/260, 265, 343; 358/191.1, 195.1

[56] References Cited
U.S. PATENT DOCUMENTS 4,078,212 3/1978 Rast ...................................... 455/182
4,241,450 12/1980 Blatter et al. ........................ 455/182
4,264,977 4/1981 Deiss ................................... 455/182
4,365,349 12/1982 Ogita et al. .......................... 455/182

FOREIGN PATENT DOCUMENTS 56-48712 5/1981 Japan .
56-52972 5/1981 Japan .
56-57324 5/1981 Japan .

Primary Examiner—Michael A. Masinick
Attorney, Agent, or Firm—Frishauf, Holtz, Goodman & Woodward

[57] ABSTRACT

A tuning device of a liquid crystal television at first tunes by a PLL synthesizer system, and then maintains an obtained tuning voltage by an AFT signal for deciding an intermediate frequency after the PLL tuning. The device interrupts the power to at least the prescaler of the PLL loop when in the AFT mode, to reduce overall power consumption.

6 Claims, 8 Drawing Figures

TUNING DEVICE FOR LIQUID CRYSTAL TELEVISION

BACKGROUND OF THE INVENTION

A PLL synthesizer system using a PLL loop, and a voltage synthesizer system using an AFT loop are both widely known as tuning systems.

When both systems are compared, the PLL synthesizer system has the advantages of higher speed, better accuracy and potential for stable reception, but also has a characteristic that its signal-to-noise ratio is inferior, due to harmonic wave components of a frequency divider signal in the PLL loop or a fluctuation of the loop. The voltage synthesizer system has the advantage of a higher S/N ratio, but has drawbacks in the tuning accuracy and stability, and a slow tuning velocity.

Therefore, there is a concept that the advantages of both systems are employed by combining both the PLL synthesizer system and the voltage synthesizer system. This concept is disclosed, for example, in Japanese patent application Laid-open Nos. 57324/1981, 52972/1981 and 48712/1981.

A liquid crystal television has been recently produced, commercially. Since this television employs a liquid crystal display unit having much less power consumption than a Braun tube, the television can be driven by a dry cell to enhance the portability. However, a reduction in the power consumption is still an important subject in the liquid crystal television, and the lifetime of the dry cell in the television is only several hours at present.

The conventional systems disclosed in the above-mentioned Japanese patent application Laid-open Nos. 57324/1981, 52972/1981 and 48712/1981 do not consider the use of liquid crystal television, nor the power consumption. The tuning device of the PLL synthesizer system has, in addition to the above-mentioned advantages, a disadvantage that the power consumption of a prescaler for dividing the local oscillation frequency of a tuner oscillating in a high frequency is large. This point is not as important in a television driven by a commercial power source, but when driven by a dry cell, as in a portable liquid crystal television, this becomes a very serious drawback. Therefore, the liquid crystal television cannot employ the PLL synthesizer system having the advantages of high speed and high accuracy.

SUMMARY OF THE INVENTION

An object of this invention is to provide a tuning device for a liquid crystal television which can save power by tuning a channel by a PLL synthesizer system, then interrupting a power source for a prescaler and thereafter maintaining a tuning voltage by an AFT loop.

In order to perform the above object there is provided, according to the present invention, a tuning device for a liquid crystal television having a tuner for tuning according to a local oscillation frequency, a linear circuit for amplifying and detecting a signal tuned by the tuner, an A/D converter for converting a video signal detected by the linear circuit, and a liquid crystal display unit for displaying the video according to a digital video signal output from the converter, comprising: a prescaler for dividing the local oscillation frequency of the tuner, a programmable counter for dividing in frequency the frequency signal divided in frequency by the prescaler to an arbitrary value, a phase comparator for comparing in phase the frequency signal divided in frequency by the counter with a reference frequency signal, a low pass filter for generating a tuning voltage for controlling the local oscillation frequency of the tuner upon receiving of a comparison signal output from the comparator, mode determining means for determining a tuning mode or receiving mode to output a decision signal, switching means for interrupting a power source of the prescaler when deciding the receiving mode by the mode deciding means, and holding means for holding the tuning voltage of the tuner constant by using an AFT signal for drawing an S-curve characteristic with an intermediate frequency as a center in the receiving mode.

DETAILED DESCRIPTION OF THE PREFERRED EMBODIMENTS

Figure 1:
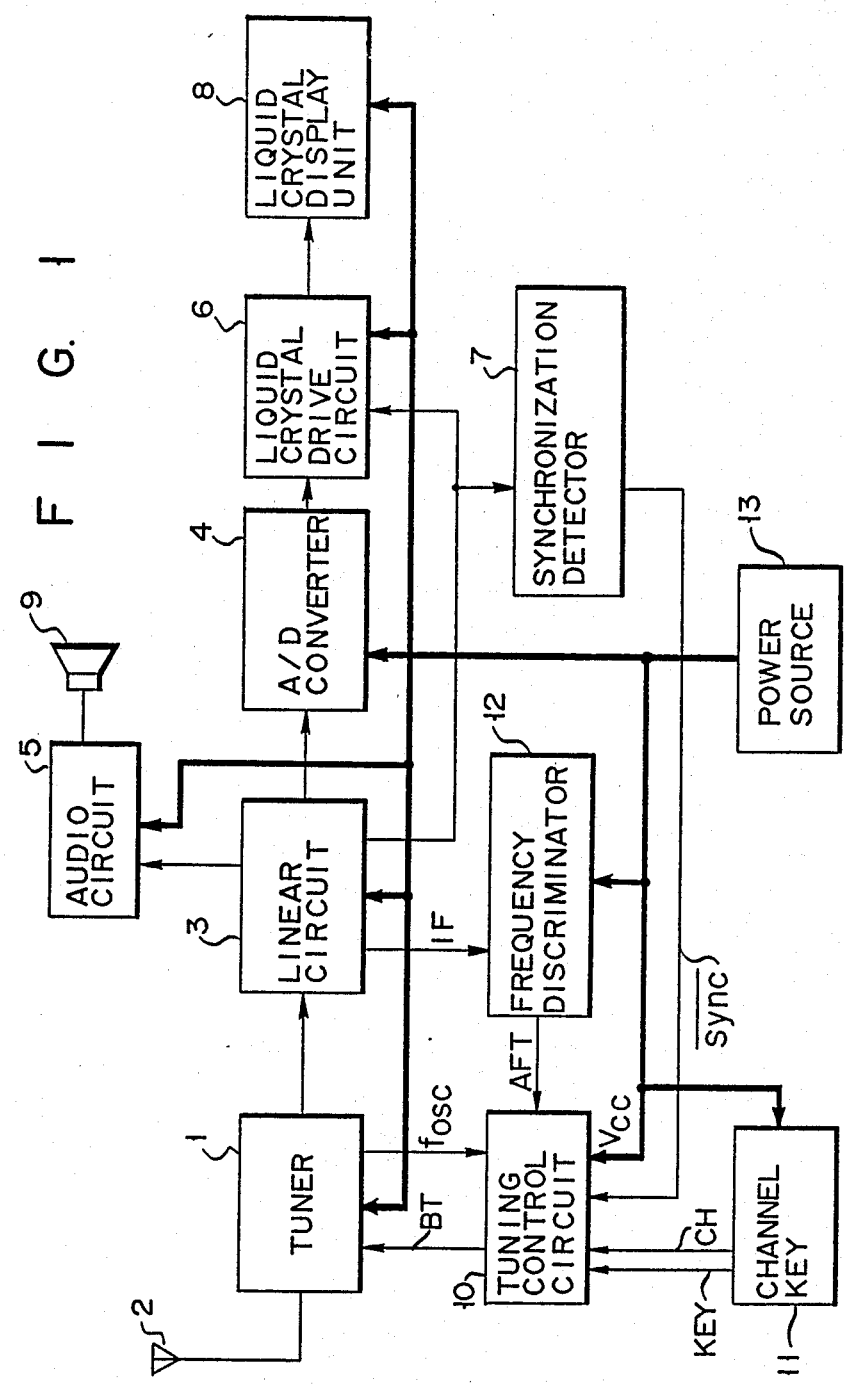
FIG. 1 is a block circuit diagram showing the entire configuration of a liquid crystal television.

FIG. 1 is a block circuit diagram showing the entire construction of a liquid crystal television. In FIG. 1, reference numeral 1 designates a tuner which tunes a desired channel by altering a local oscillation frequency $f_{OSC}$ in radio waves induced in antenna 2 to convert it into an intermediate frequency. Numeral 3 designates a linear circuit which amplifies and detects the intermediate frequency signal output from tuner 1 to produce a video signal, an audio signal and a synchronizing signal. The video signal is supplied to A/D converter 4, the audio signal is supplied to audio circuit 5, and horizontal and vertical synchronizing signals are supplied to liquid crsytal drive circuit 6 and synchronization detector 7. A/D converter 4 samples the video signal detected by linear circuit 3 in synchronization with a sampling block signal and converts it into a digital video signal. Drive circuit 6 converts the digital video signal into a liquid crystal drive voltage in synchronization with the synchronizing signals to drive liquid crystal display unit 8. Audio circuit 5 receives the audio signal output from linear circuit 3 and drives speaker 9. Detector 7, when detecting the synchronizing signals from linear circuit 3 continuously for a predetermined period, outputs a synchronization presence signal $\overline{Sync}$.

Reference numeral 10 designates a tuning control circuit, the detail of which will be described later, and which provides tuning voltage BT to tuner 1 to control a tuning frequency. Control circuit 10 receive channel designation signal CH from channel key 11, local oscillation frequency $f_{OSC}$ from tuner 1 and an AFT signal from frequency discriminator 12, and raises or lowers tuning voltage BT in response to the input signals received from them. Key 11 outputs channel designation signal CH and key operation signal $\overline{\text{Key}}$ for deciding the number of dividing frequency to a PLL programmable counter to be described later, and an up/down key has keys for the respective channels to be alternatively selected. The discriminator 12 discriminates intermediate frequency signal IF from linear circuit 3, and outputs an AFT signal of substantially an S-shape with the intermediate frequency as a center.

Reference numeral 13 designates a power source which supplies power to the respective circuits.

Figure 2:
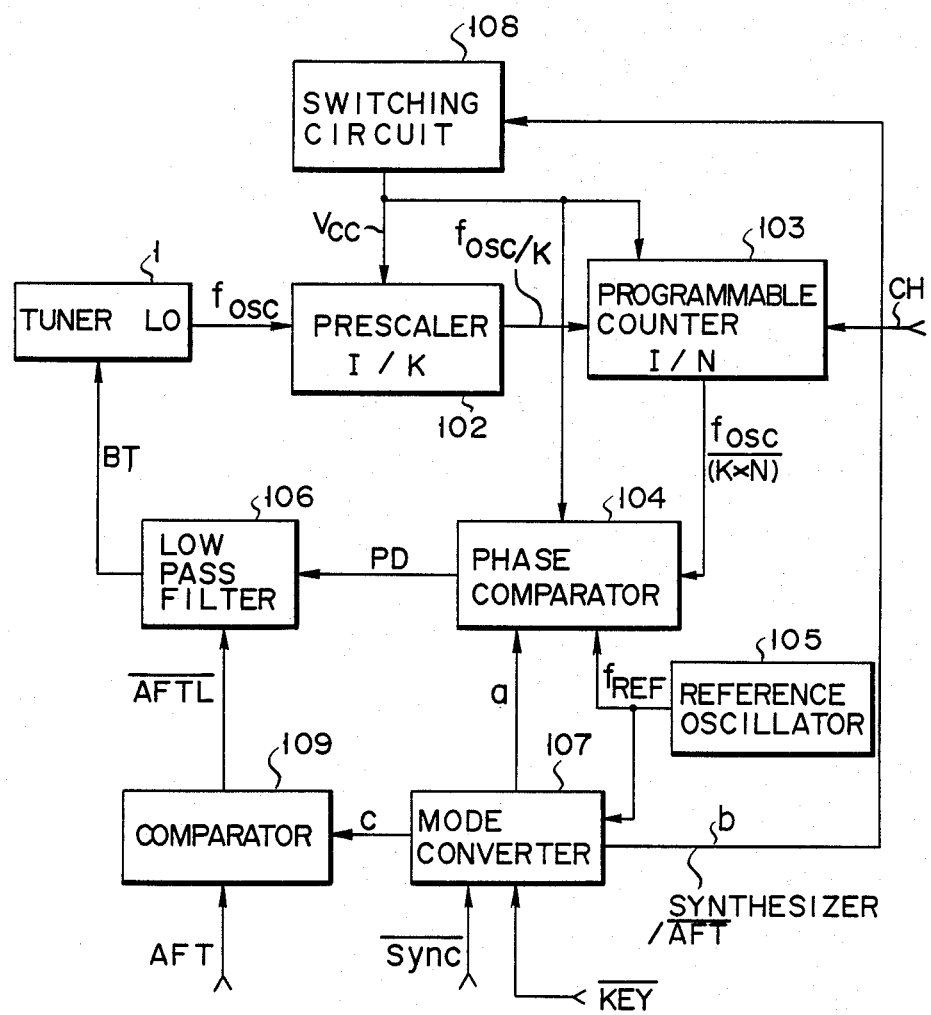
FIG. 2 is a block circuit diagram showing the configuration of an automatic tuning unit.

Referring to FIG. 2, tuning control circuit 10 will be described in detail.

Local oscillation output $f_{OSC}$ of tuner 1 is divided by K by prescaler 102, and further divided by arbitrary value N by programmable counter 103. The value of N is decided by channel designation signal CH from channel key 11. Reference numeral 104 designates a phase comparator which compares, in phase, the frequency signal output from counter 103 with the reference frequency signal $f_{REF}$ output from reference oscillator 105, having a crystal oscillator, and supplies its comparison output PD to low pass filter 106. Filter 106 removes high frequency components of input comparison signal PD, voltage-amplifies the signal, and supplies it as tuning voltage BT to tuner 1 to regulate frequency $f_{OSC}$.

Figure 3:
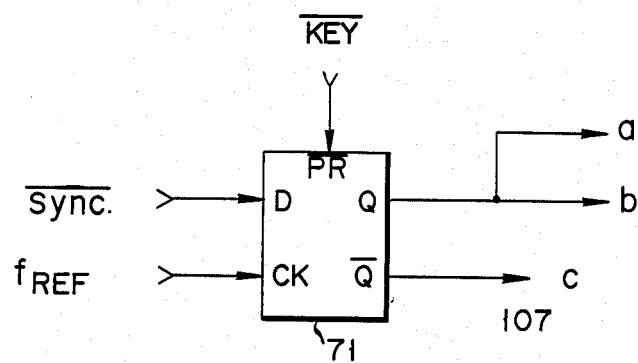
FIG. 3 is a block diagram showing the construction of a mode converter in FIG. 2.
Figure 4:
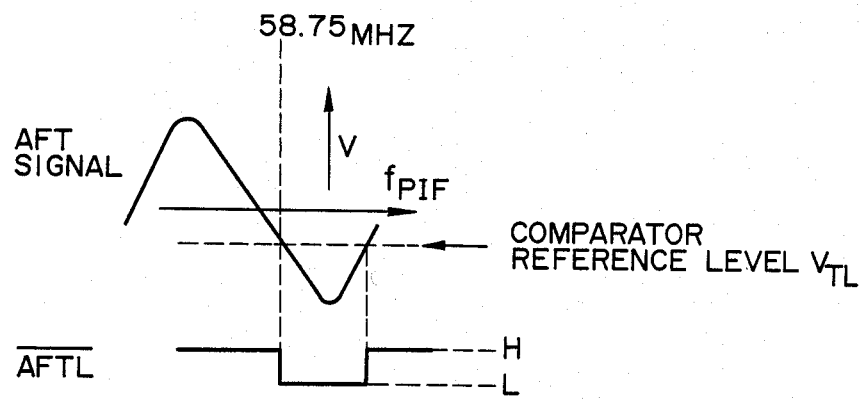
FIG. 4 is a view for describing the operation of a comparator in FIG. 2.

Reference numeral 107 designates a mode converter for converting between a PLL mode and an AFT mode, and receives reference signal $f_{REF}$ from oscillator 105 as a clock. Converter 107 converts to the PLL mode by key operation signal $\overline{\text{Key}}$ from key 11, and converts to the AFT mode when the channel is locked so that synchronization signal $\overline{\text{Sync}}$ is output from detector 7. A mode converter 107, when in the PLL mode, produces output signals a and b (being "H") to activate comparator 104 and switching circuit 108, while, when in the AFT mode, produces output signals a and b (being "L") to activate comparator 109. Converter 107 has D flip-flop 71 as shown in FIG. 3. Switching circuit 108 supplies power to prescaler 102, programmable counter 103 and phase comparator 104. Switching circuit 108 supplies power to the circuits when output signal b from converter 107 is "H" and interrupts the power to the circuits when the signal b becomes "L". Comparator 109 compares the $\overline{\text{AFTL}}$ signal from discriminator 12 with a predetermined reference level as shown in FIG. 4 and supplies an $\overline{\text{AFTL}}$ signal to filter 106 when lower than the reference level.

Figure 5:
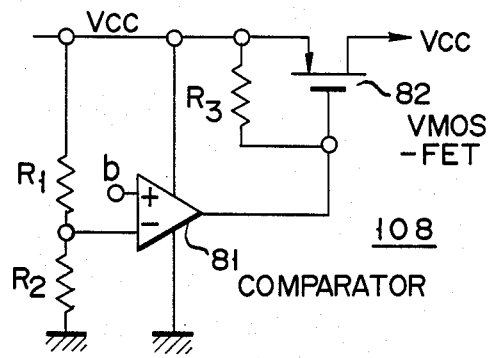
FIG. 5 is a view showing the construction of a switching circuit in FIG. 2.

Referring to FIG. 5, the construction of switching circuit 108 will be described. Reference numeral 81 designates a comparator. A reference voltage produced by dividing power source voltage Vcc by resistors R1 and R2 is applied to negative (−) terminal of comparator 81, and output signal b from converter 107 is applied to positive (+) terminal of comparator 81. The output signal of comparator 81 is inputted to the gate of VMOS-FET 82. FET 82 receives power source voltage Vcc to the source thereof, and produces a drain output to prescaler 102, counter 103 and comparator 104 as power. Bias resistor R3 is connected between the source and the gate of FET 82.

Figure 6:
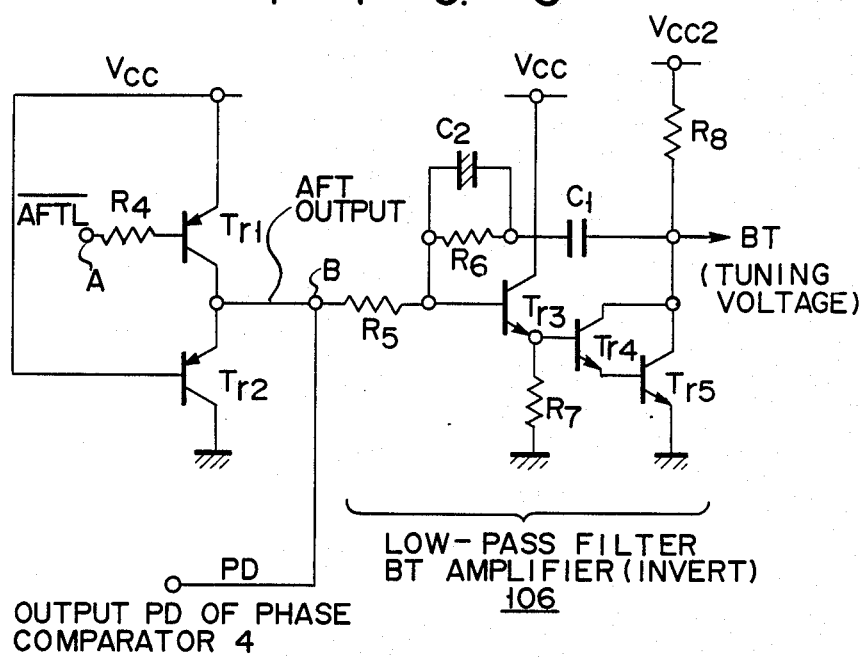
FIG. 6 is a view showing the construction of a low pass filter in FIG. 2.

Referring to FIG. 6, the construction of filter 106 will be described. Transistors Tr1, Tr2 connected in cascade in FIG. 6 switch the output at point B by $\overline{\text{AFTL}}$ signal of comparator 109 input from terminal A through resistor R4 when the $\overline{\text{AFTL}}$ signal becomes "L", transistor Tr1 is turned ON, and point B becomes Vcc, while when the $\overline{\text{AFTL}}$ signal becomes "H", transistor Tr1 is turned OFF, and point B becomes high impedance. Output PD of comparator 104 is applied to point B. Since either one of comparators 104 and 109 is activated by converter 107, the potential of point B is controlled by output PD of comparator 104 in the PLL mode and by output $\overline{\text{AFTL}}$ of comparator 109 in the AFT mode. Capacitor C1, resistors R5, R6, R7 and transistors Tr3, Tr4, Tr5 form an active inverting low pass filter, and power source voltage Vcc2 of relatively high voltage and resistor R8 are connected to the filter to amplify the output for a tuning voltage.

The operation of the tuning device constructed as described above will be described.

Figure 7:
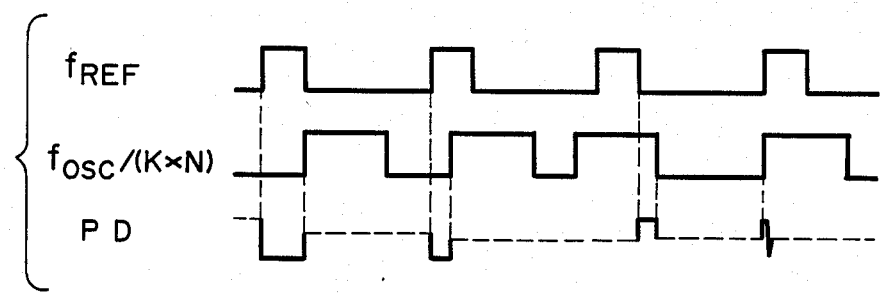
FIG. 7 is a view for describing the phase comparing operation.

Converter 107 is in the PLL mode during ordinary tuning, and output signals a and b become "H". Local oscillation frequency $f_{OSC}$ of tuner 1 is divided by K by prescaler 102, and the frequency signal of $f_{OSC}/K.N$ divided by N responsive to the channel by counter 103 is compared, in phase, with oscillation output $f_{REF}$ of oscillator 105 by comparator 104. When local oscillation frequency $f_{OSC}$ of tuner 1 becomes higher than reference frequency $f_{REF}$, the output supplied from comparator 104 to filter 106 becomes "H", while when frequency $f_{OSC}$ becomes lower, the output becomes "L". When both coincide, the output becomes high impedance, thereby performing the PLL operation. The relationship between reference frequency $f_{REF}$, output $f_{OSC}/KN$ of counter 103 and output PD of comparator 104 at this time is shown in FIG. 7.

Since output signal c of converter 107 becomes "L", $\overline{\text{AFTL}}$ is not applied from comparator 109 to terminal A of filter 106, and transistor Tr1 is turned OFF. Therefore, filter 106 is operated by output PD of comparator 104. In the circuit of filter 106, the base voltage of transistor Tr3 is always held at approx. 2.1 V (0.7V × 3) by the emitter follower of transistor Tr3 and Darlington connection of transistors Tr4, Tr5. When point B becomes "H", capacitor C1 is discharged by discharging current I1 of the following equation, and tuning voltage BT falls.

$$I_1 \approx \frac{V_{cc} - 2.1}{R5} \quad (A)$$

When point B becomes "L", capacitor C1 is charged by charging current I2 of the following equation, and tuning voltage BT rises.

$$I_2 \approx 2.1/R5 \quad (A)$$

When point B becomes high impedance, capacitor C1 receives almost no current. Therefore, tuning voltage BT is held. However, since the base current of transistor Tr3 is partially flowed, the current is gradually charged in capacitor C1, and tuning voltage BT rises. The time constant substantially relates to the input impedance of transistor Tr3. When the time constant is represented by $R_{T3}$, is becomes approx. $1/R_{t3} \cdot C2$ ($R5 < < R_{T3}$, $R8 < < R_{T3}$ are considered).

Figure 8:
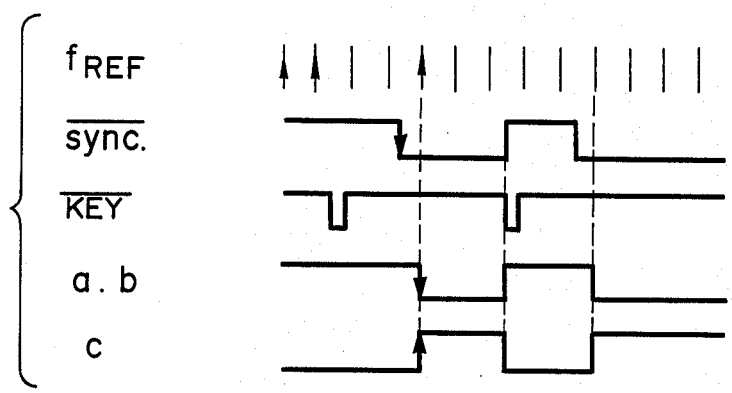
FIG. 8 is a view for describing the operation of a mode converter.

Whe tuned by the above-mentioned PLL loop, synchronization signal $\overline{\text{Sync}}$ is applied from detector 7 to converter 107. Then, as shown in FIG. 8 flip-flop 71 reads "L" of synchronization signal $\overline{\text{Sync}}$ by next clock $f_{REF}$, its output signal Q, i.e., C becomes "H" to activate comparator 109, while its output $\overline{Q}$, i.e., a becomes "L" in invalidate comparator 104. Since output signal b becomes "L", FET 82 of switching circuit 108 is turned OFF to interrupt the powers to prescaler 102, counter 103 and comparator 104. Since output PD of comparator 104 becomes high impedance, filter 106 operates by $\overline{\text{AFTL}}$ signal from comparator 109. Therefore, the tuning voltage BT gradually rises by the characteristic of the above active low pass filter. Then, intermediate frequency $f_{PIF}$ rises, and when it exceeds 58.75 MHz, the AFT signal reduces to a point lower than the comparator reference level $V_{TL}$, as shown in FIG. 4, and the $\overline{\text{AFTL}}$ signal becomes "L". Then, the operations where BT falls, $f_{PIF}$ falls, $\overline{\text{AFTL}}$ becomes "H" and BT rises, . . . are repeated to maintain the tuning voltage.

When key 11 is operated to alter the channel, key operation signal $\overline{\text{Key}}$ is applied to the preset terminal of flip-flop 71 to form converter 107 as shown in FIG. 8. Thus, flip-flop 71 is set to "H" at Q and "L" at $\overline{\text{Q}}$, and produces output signals a and b being "H" and c being "L". Therefore, the PLL mode is again obtained by prescaler 102 and so on of the PLL loop, to tune by means of the PLL synthesizer.

According to the present invention as described above, the tuning is conducted accurately and at high speed by the PLL synthesizer system, and after the tuning, the tuning voltage is maintained by the AFT loop, and the power for the PLL loop including the prescaler and so on is interrupted. Therefore, power consumption can be conserved while utilizing the advantages of the PLL synthesizer system.

What is claimed is:

1. A tuning device for a liquid crystal television having a tuner for tuning according to a local oscillation frequency, a linear circuit for amplifying and detecting an intermediate frequency signal produced by the tuner, an A/D converter for converting a video signal detected by the linear circuit to a digital video signal, and a liquid crystal display unit for displaying video according to the digital video signal output from the A/D converter, comprising:

a power source;
a prescaler for dividing the local oscillation frequency of the tuner by a predetermined ratio when said power source is connected to the prescaler,
a programmable counter for dividing further the frequency signal divided by said predetermined ratio by said prescaler to a selected value when said power source is connected to said couter,
a phase comparator for comparing in phase the signal divided further by said counter with a reference frequency signal when said power source is connected to the phase comparator,
a low pass filter for generating a tuning voltage for controlling the local oscillation frequency of said tuner in response to a comparison signal output from said comparator,
mode deciding means for selecting one of a tuning mode and a receiving mode in response to operating conditions of the liquid crystal television, to output a decision signal,
switching means for interrupting said power source at least to said prescaler when the receiving mode is determined by said mode deciding means, and
holding means coupled to said mode deciding means for holding the tuning voltage of said tuner constant, including means for generating an AFT signal for drawing an S-curve characteristic with the intermediate frequency as a center, when in the receiving mode.

2. The tuning device according to claim 1, wherein said holding means comprises a comparator, for comparing the AFT signal with a threshold level to output a comparison signal, and said low pass filter is responsive the comparison signal output from said comparator, for raising or lowering the tuning voltage in response to the comparison signal.

3. The tuning device according to claim 2, wherein said comparator outputs a comparison signal of a first value, when the AFT signal is lower than an intermediate frequency signal, and of a second value, when the AFT signal is higher than the intermediate frequency signal, and said low pass filter operates to raise the tuning voltage when the comparison signal is the first value and to lower the tuning voltage when the comparison signal is the second value.

4. The tuning device according to claim 2, wherein said low pass filter is connected to said phase comparator, and said low pass filter includes circuit means responsive to either one of the comparison signals output from said phase comparator and the comparator of said holding means.

5. The tuning device according to claim 1, wherein said switching means is connected to said mode deciding means and to said prescaler to interrupt the power of said prescaler when the decision signal output from said mode deciding means indicates the receiving mode.

6. The tuning device according to claim 1, wherein said switching means is connected to said mode deciding means, said prescaler, said programmable counter and said phase comparator to interrupt the power to said prescaler, said programmable counter and said phase comparator when the decision signal output from said mode deciding means indicates the receiving mode.

* * * * *